United States Patent [19]

Kimura et al.

[11] Patent Number: 5,380,373

[45] Date of Patent: Jan. 10, 1995

[54] FLOATING SINGLE CRYSTAL THIN FILM FABRICATION METHOD

[75] Inventors: Mitsuteru Kimura; Noriaki Suzuki, both of Miyagi, Japan

[73] Assignee: Ricoh Seiki Company, Ltd, Tokyo, Japan

[21] Appl. No.: 91,065

[22] Filed: Jul. 14, 1993

[30] Foreign Application Priority Data

Jul. 14, 1993 [JP] Japan .................................. 4-186833

[51] Int. Cl.⁶ .................. H01L 21/30; H01L 21/306; B44C 1/22
[52] U.S. Cl. .................................... 148/33.2; 156/628; 156/644; 156/647; 156/651; 156/657; 156/662; 437/228; 437/927
[58] Field of Search ............... 156/628, 644, 647, 650, 156/651, 656, 657, 659.1, 662; 437/228, 901, 927, 985; 148/33.1, 33.2

[56] References Cited

U.S. PATENT DOCUMENTS

| | | | |
|---|---|---|---|
| 4,783,237 | 11/1988 | Aine et al. | 156/647 X |
| 5,129,983 | 7/1992 | Greiff | 156/628 |
| 5,242,863 | 9/1993 | Xiang-Zheng et al. | 437/228 |

FOREIGN PATENT DOCUMENTS 62-2438 1/1987 Japan .

Primary Examiner—William A. Powell
Attorney, Agent, or Firm—Lowe, Price, LeBlanc & Becker

[57] ABSTRACT

The present invention comprises a first process to enclose a floating single crystal thin film with a enclosure material which is hardly affected by an isotropic etchant using a face with the lowest etch rate against an anisotropic etchant as a front surface of a single crystal substrate, a second process to cover a portion of or the entire surface of the single crystal substrate with a cover material which is hardly etched by the anisotropic etchant nor by the isotropic etchant, a third process to form an etched groove by etching and removing a portion of the single crystal substrate in the outer side or under a region enclosed by the enclosure material using the isotropic etchant, and a fourth process to deposit a floating single crystal thin film by etching and removing a portion of the single crystal thin film using the anisotropic etchant and making use of the etched groove.

19 Claims, 4 Drawing Sheets

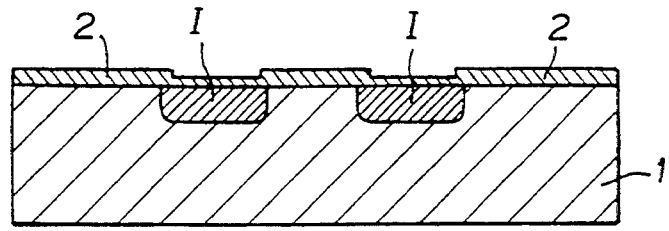
FIG. I(a)
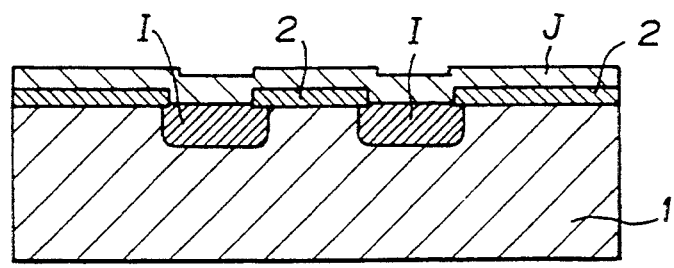
FIG. I(b)
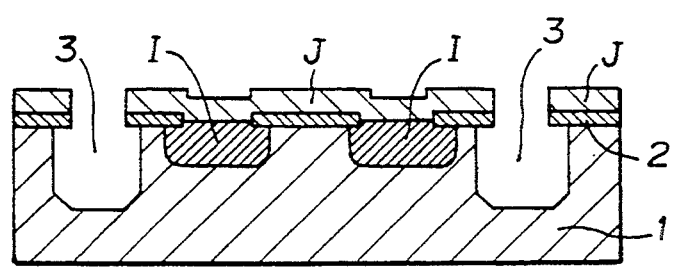
FIG. I(c)
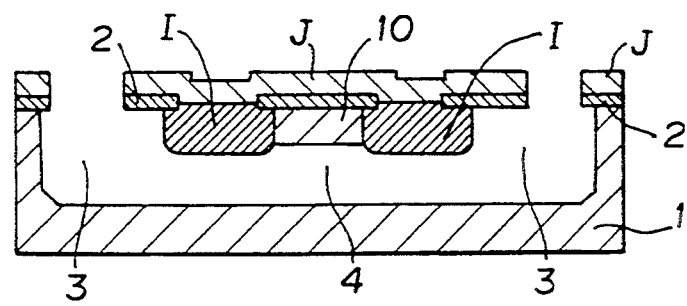
FIG. I(d)

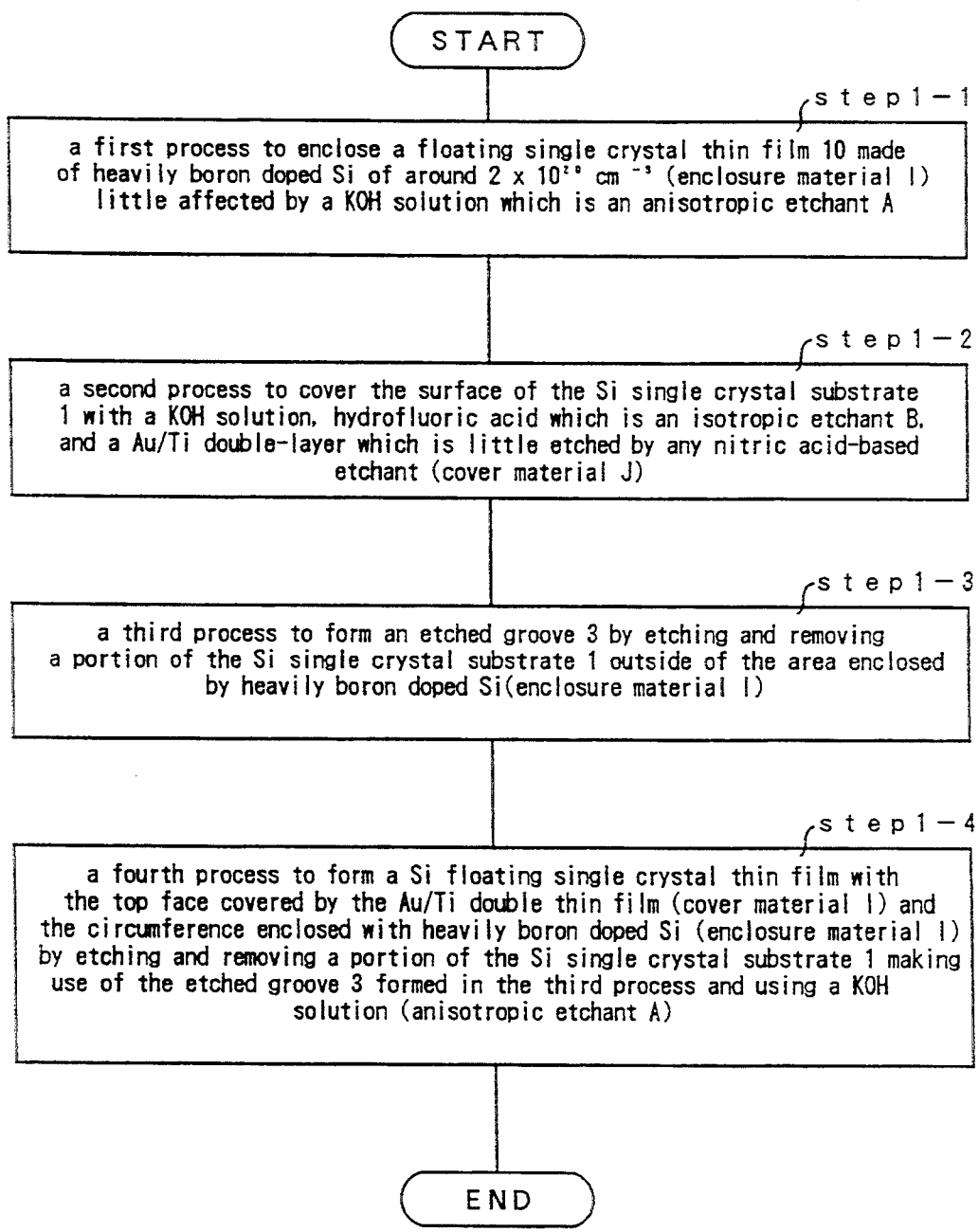

FLOATING SINGLE CRYSTAL THIN FILM FABRICATION METHOD

FIELD OF THE INVENTION

The present invention relates to a method of preparation of a floating single crystal thin film comprising a portion of a single crystal substrate and is applied to fabrication of such a device as an infrared sensor or a flow sensor.

BACKGROUND OF THE INVENTION

In a device relating to heat, it is often required to minimize power inputted thereinto and at the same time to raise temperature as much and rapidly as possible. To achieve this object, it is necessary to make as small as possible a heat conductance as well as a heat capacity of a section where temperature rises. The best way to achieve the object is to realize a thin film construction in which the section where temperature rises is floating, namely so-called the floating thin film construction. The present applicant proposed a micro-heater based on the floating thin film construction in the patent application for an "electric heater" (Japanese Patent No. 1398241), and since then micro-heaters based on this floating thin film construction or various types of heat device using the floating thin film construction have been developed and put into practical use.

Conventionally such a material as amorphous insulating thin film or metallic thin film including oxidized silicon film and silicon nitride film has been used for the floating thin film construction, but as it is easier to directly form a device in or on the single crystal thin film, development of a floating single crystal thin film construction has been aspired. There has been a method of preparation of a floating single crystal thin film made of heavily boron doped Si making use of the fact that, when boron is doped to Si, the resultant thin film is little affected by such an anisotropic etchant such as a KOH solution or a hydrazine solution, but as the heavily boron deposed Si has an extremely low resistance, it is difficult to directly form a semiconductor device in or on the heavily doped thin film, so that it has been necessary to deposit an epitaxial growth thin film with lightly doped impurities and form a semiconductor device in or on the thin film.

Also as a way of preparation of a floating single crystal thin film made of lightly doped impurity, there has been a method of depositing an epitaxial growth thin film with lightly doped impurities in a Si substrate having a different conduction type from that of the epitaxial growth thin film (for instance, the substrate must be of p-type, if the epitaxial growth thin film is of n-type) and then carrying out etching while applying a voltage to the anisotropic etchant so that a p-n junction formed there is biased in the reverse direction. In this method, however, it is necessary to use an expensive epitaxial growth substrate, and if a partial floating single crystal thin film should be doped, it is necessary to establish an electrical connection to the section, which is disadvantageous.

SUMMARY OF THE INVENTION

It is an object to provide a method of preparation of a floating single crystal thin film having nothing to do with an impurity concentration or conduction type in a portion of a floating thin film including the circumference.

In the present invention, in order to deposit a floating single crystal thin film comprising a portion of a single crystal substrate by removing a portion of the single crystal substrate, at first a first process to enclose a floating single crystal thin film to be doped with a enclosure material which is little etched by an anisotropic etchant is carried out, using a surface having the lowest etch rate to the anisotropic etchant as a front face of the single crystal substrate, to protect the circumference of the floating single crystal thin film from the anisotropic etchant. Then a second process to cover a portion of the surface of or the entire surface of the single crystal substrate with a cover material little etched by the anisotropic etchant nor by an isotropic etchant is carried out to protect the surface of the floating single crystal thin film to be doped from the anisotropic etchant and the isotropic etchant for the single crystal substrate to be used in a third process. In these processes, a material of the enclosure material may be the same as that of the cover material. Then, a third process to remove by etching the outer side of the region enclosed by the enclosure material or a portion of the single crystal substrate under the enclosure material using the isotropic etchant to form an etched groove is carried out. Then a fourth process to form a floating single crystal thin film with the top surface covered by the cover material and the circumference enclosed by the enclosure material by etching and removing a portion of the single crystal substrate making use of the etched groove and using the anisotropic etchant.

Other objects and features of this invention will become understood from the following description with reference to the accompanying drawings.

BRIEF DESCRIPTION OF THE DRAWINGS

FIGS. 1(a)-(d) are a drawing illustrating fabrication processes in one embodiment of a method of preparation of a floating single crystal thin film according to the present invention, and (a), (b), (c) and (d) show the first process, the second process, the third process, and the fourth process respectively;

FIG. 2 is flow chart illustrating fabrication processes in one embodiment of a method of preparation of a floating single crystal thin film according to FIG. 1.

DESCRIPTION OF THE PREFERRED EMBODIMENTS

Embodiment 1

Figure 3A:
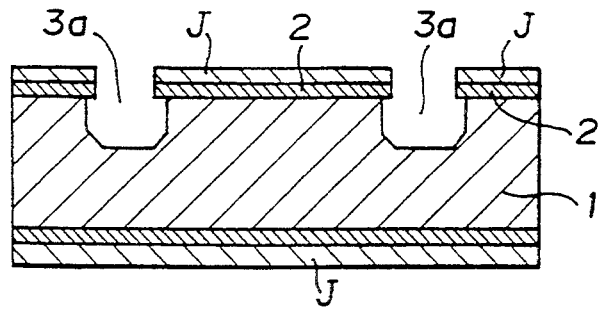
FIGS. 3(a)-(d) are a drawing illustrating fabrication processes in another embodiment of a method of preparation of a floating single crystal thin film according to the present invention in a case where the etched groove is formed only in the rear surface of the single crystal substrate, and (a), (b), (c) and (d) show the first process and the second process, the third process, the fourth process and the fifth process, and the sixth process respectively.

Description is made below for a method of preparation of a floating single crystal thin film according to the present invention with a reference to one embodiment thereof wherein the method is applied to a single crystal silicon (Si) on a (111) face. A (111) face of single crystal silicon is a facial orientation having the lowest etch rate against an anisotropic etchant A such as a KOH solution, an EDP solution, or a hydrazine solution. Especially in a KOH solution, it is known that an etch rate on the (111) face is about one six hundredth (1/600) of that in other facial orientation, for instance, in (100) or (110) facial orientation. In this embodiment, a KOH solution is used as an anisotropic etchant A, while hydrofluoric acid and nitric acid-based etchant are used as an isotropic etchant B. FIG. 1 (a), (b), (c), (d) and FIG. 2 are schematic diagrams each illustrating a process in an embodiment of a method preparation of a floating single crystal thin film according to the present invention using a Si single crystal substrate 1 having a (111) face, and FIG. 1(a) is a drawing illustrating a first process to enclose a floating single crystal thin film 10 made of heavily boron doped Si of around $2 \times 10^{20} cm^{-3}$ (enclosure material I) little affected by a KOH solution which is an anisotropic etchant A(step1-1); FIG. 1(b) is a second process to cover the surface of the Si single crystal substrate 1 with a KOH solution, hydrofluoric acid which is an isotropic etchant B, and a Au/Ti double-layer which is little etched by any nitric acid-based etchant (cover material J) (step1-2); FIG. 1(c) is a third process to form an etched groove 3 by etching and removing a portion of the Si single crystal substrate 1 outside of the area enclosed by heavily boron doped Si (enclosure material I) (step1-3); and FIG. 1(d) is a fourth process to form a Si floating single crystal thin film with the top face covered by the Au/Ti double thin film (cover material J) and the circumference enclosed with heavily boron doped Si (enclosure material I) by etching and removing a portion of the Si single crystal substrate 1 making use of the etched groove 3 formed in the third process and using a KOH solution (anisotropic etchant A) (step1-4).

More detailed description is made hereinafter with reference to the related drawings. At first, a Si single crystal substrate 1 on the (111) face is thermally oxidized to form a SiO$_2$ film 2 having the thickness of 0.5 $\mu$m, and then a window for diffusion having the width of, for instance, 200 $\mu$m is formed so that the window encloses a region to be left as a Si floating single crystal thin film 10, for instance, a 50 $\mu$m (width)$\times$200 $\mu$m region, and boron is diffused to the depth of around 6 $\mu$m at a high density of $2 \times 10^{20} cm^{-3}$ (FIG. 1(a)). This Si region with boron doped therein at a high density is the enclosure material I shown in each process drawing (FIG. 1(a)–(d)). Then Ti (around 0.05 $\mu$m) and Au are overlaid for sputtering to deposit a metallic double thin film (cover material J, around 0.3 $\mu$m) (FIG. 1 (b)). Then windows for isotropic etching of the Si single crystal substrate 1 are formed in both the two outer side of the Si region with boron doped therein at a high density in the AU/Ti double thin film (cover material J), an etched groove with the depth of around 20 $\mu$m is formed through this window in the Si single crystal substrate 1 using hydrofluoric acid which is an isotropic etchant B and a nitric acid-based etchant (FIG. 1(c)). Then making use of the etching trench 3, a portion of the enclosure material I which is a Si region with boron doped therein at a high density as well as a portion of the Si single crystal substrate 1 under the floating single thin film 10 is removed by etching to form a hollow through-section 4, and with this a floating single crystal thin film 10 supported by the circumference material I which is an Si region with boron doped therein at a high density is formed. The Au/Ti double thin film (cover material J) may be removed by etching according to the necessity.

Embodiment 2

Figure 4:
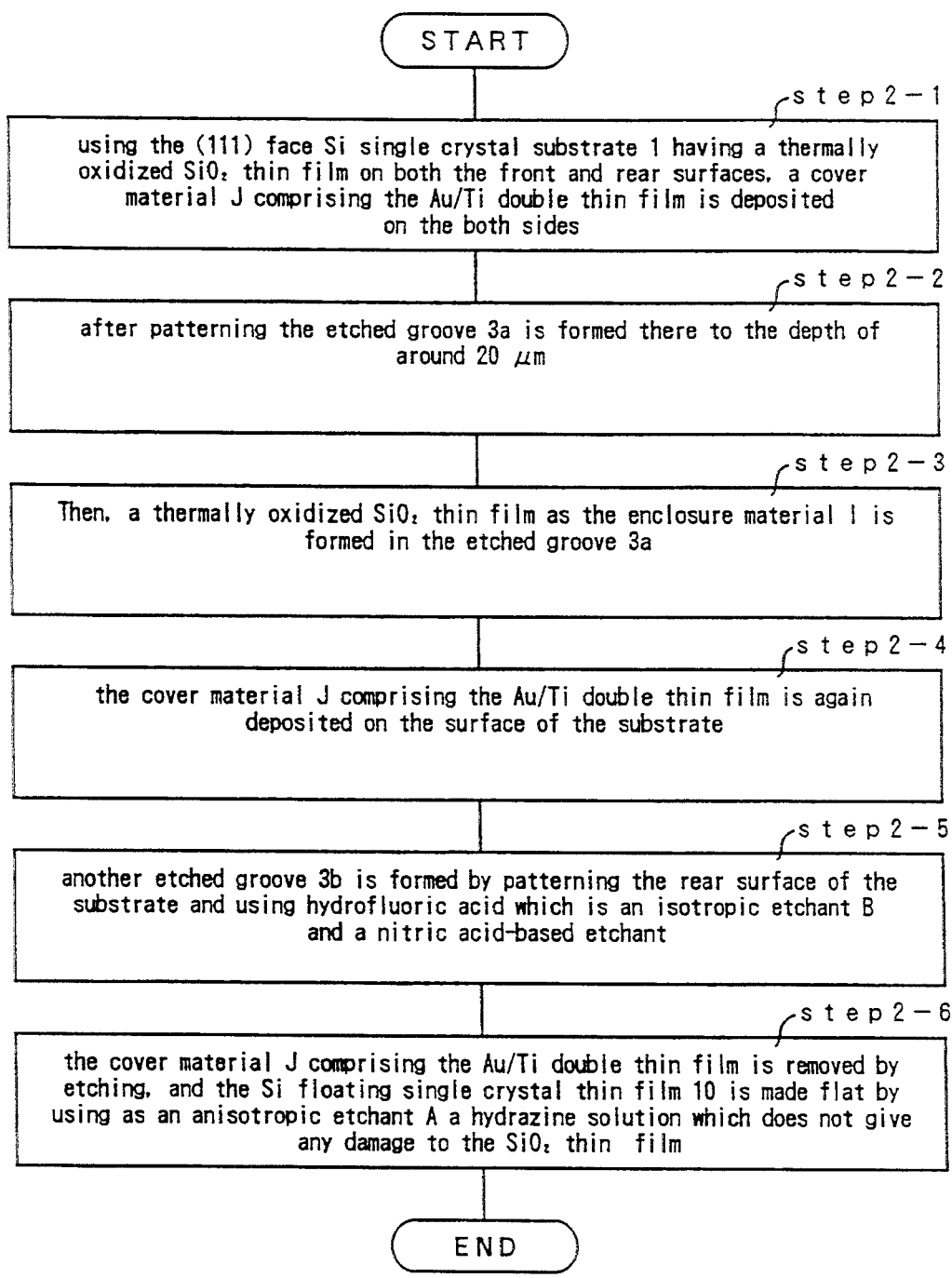
FIG. 4 is flow chart illustrating fabrication processes in one embodiment of a method of preparation of a floating single crystal thin film according to FIG. 3.

FIG. 3(a), (b), (c), (d) and FIG. 4 are schematic drawings each illustrating another embodiment of a method for preparation of a floating single crystal thin film according to the present inventing using the Si single crystal substrate 1 having a (111) face, and this embodiment is almost the same as Embodiment 1, but is largely different from the latter in that, although a Si region with boron doped therein at a high density is used as the enclosure material I in Embodiment 1, an SiO$_2$ thin film formed by thermally oxidizing a portion of the Si single crystal substrate 1 exposed in the etched groove 3a is used in Embodiment 2, that another etched groove 3b is provided also in a rear surface of the Si single crystal substrate and this etched groove 3b is caused to reach the enclosure material I of the SiO$_2$ film in the etched groove 3a provided in the front surface of the Si single crystal substrate 1, and that the (111) face under the Si floating single crystal thin film 10 is made flat by using a hydrazine solution in place of a KOH solution as an anisotropic etchant A so that the SiO$_2$ thin film will be protected, after the cover material comprising the AU/Ti double thin film is chemically etched and removed.

Figure 3B:
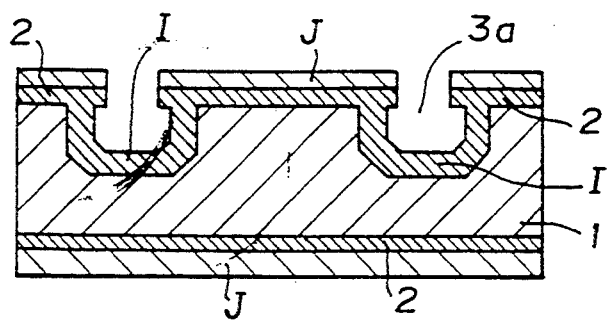
Figure 3C:
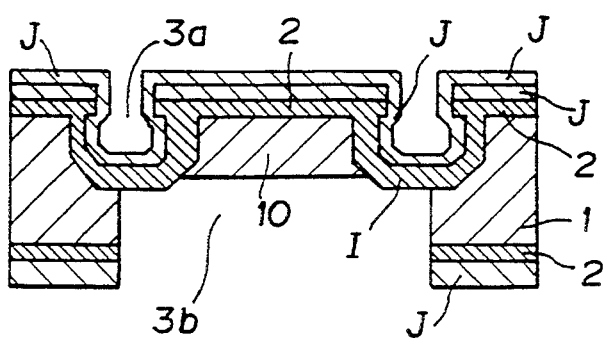
Figure 3D:
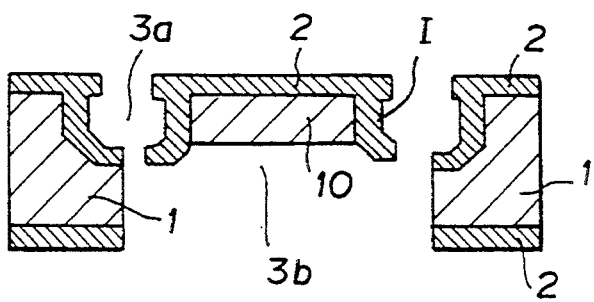

More detailed description is made for this embodiment 2 with reference to the related drawings. Detailed description for the same processes in this embodiment as those in Embodiment 1 is omitted here. At first, using the (111) face Si single crystal substrate 1 having a thermally oxidized SiO$_2$ thin film on both the front and rear surfaces, a cover material J comprising the Au/Ti double thin film is deposited on the both sides (step2-1), and after patterning the etched groove 3a is formed there to the depth of around 20 $\mu$m (step2-2) (FIG.3 (a)). Then, a thermally oxidized SiO$_2$ thin film as the enclosure material I is formed in the etched groove 3a (step2-3) (FIG. 3(b)). Then, the cover material J comprising the Au/Ti double thin film is again deposited on the surface of the substrate (step2-4), and another etched groove 3b is formed by patterning the rear surface of the substrate and using hydrofluoric acid which is an isotropic etchant B and a nitric acid-based etchant (step2-5) (FIG. 3(c)). Then, the depth of the etched groove 3b from the rear surface is up to the position of the thermally oxidized SiO$_2$ thin film (enclosure material I) in the etched groove 3a. The etch stop can be decided, for instance, by using a light passing through the etched groove 3a and the etched groove 3b. The hydrofluoric acid and the nitric acid-based etchant give damages to the thermally oxidized SiO$_2$ thin film (enclosure material I), so that the portion under the thermally oxidized SiO$_2$ thin film (enclosure material I) is etched and removed by prolonging the etching time a little. Then the cover material J comprising the Au/Ti double thin film is removed by etching, and the Si floating single crystal thin film 10 is made flat by using as an anisotropic etchant A a hydrazine solution which does not give any damage to the SiO$_2$ thin film (step2-6) (FIG. 3(d)).

In all the embodiments described above, the present invention is applied to a Si single crystal substrate, but it is needless to say that the present invention is also applicable to other types of single crystal substrate 1 made of such a material as GaAs. Of course also the anisotropic etchant A and the isotropic etchant B, the enclosure material I and the cover material J should be changed according to the types of single crystal substrate 1 or other conditions.

As described above, with the method of floating single crystal thin film according to the present invention, it is possible to deposit a floating single crystal thin film in a portion of a floating thin film including a enclosure material easily and regardless of an impurity concentration therein or a conduction type thereof.

It should be noted that the processes should not always be carried out according to the sequence described above, and also that each process may be repeated according to the necessity.

It is possible to use an anisotropic etchant A instead of an isotropic etchant B.

Although the invention has been described with respect to specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of forming a floating portion of a single crystal substrate which comprises:
   surrounding a surface portion of a single crystal substrate with an enclosure material which is resistant to etching by an anisotropic etchant, said surrounded surface portion having a depth which extends below a surface of said single crystal substrate;
   covering at least said enclosure material and another surface portion of the single crystal substrate with a covering material which is resistant to etching by said anisotropic etchant;
   forming a well in said single crystal substrate on each opposite outer side of said enclosure material; and
   forming a floating portion of a single crystal substrate by etching a portion of said single crystal substrate with said anisotropic etchant, said etched portion of said single crystal substrate extending between said wells and beneath said enclosure material.

2. A method of forming a floating portion of a single crystal substrate which comprises:
   covering at least a portion of the surface of a single crystal substrate with a first cover material which is resistant to etching by an anisotropic etchant;
   forming a well in said first covering material and in said underlying single crystal substrate;
   surrounding a portion said single crystal substrate with an enclosure material which is resistant to etching by said anisotropic etchant, said surrounded portion having a depth which extends below a surface of said single crystal substrate;
   covering at least said enclosure material and another portion of the single crystal substrate with a covering material which is resistant to etching by said anisotropic etchant;
   forming a well in said single crystal substrate on each opposite outer side of said enclosure material; and
   forming a floating portion of a single crystal substrate by etching a portion of said single crystal substrate with said anisotropic etchant, said etched portion of said single crystal substrate extending between said wells and beneath said enclosure material.

3. The method of claim 1, wherein said anisotropic etchant comprises potassium hydroxide.

4. The method of claim 1, wherein said enclosure material comprises boron doped silicon.

5. The method of claim 1, wherein covering materials comprises a double layer of gold and titanium.

6. The method of claim 2, wherein said anisotropic etchant comprises potassium hydroxide.

7. The method of claim 2, wherein said enclosure material comprises boron doped silicon.

8. The method of claim 2, wherein covering materials comprises a double layer of gold and titanium.

9. A floating single crystal thin film comprising:
   a) a single crystal substrate;
   b) an enclosure material having an impurity concentration therein formed in said single crystal substrate so as to enclose a portion of said single crystal substrate;
   c) a covering layer formed on a portion of said single crystal substrate and said enclosure material;
   d) at least two windows extending through said insulating layer and into said single crystal substrate;
   e) a hollow through section formed in said single crystal substrate extending between said windows and beneath said portion of said single crystal substrate;
   f) wherein a single crystal thin film is formed above said hollow through sections and enclosed by said enclosure material.

10. The floating single crystal thin film of claim 9 wherein said single crystal substrate is silicon having a (111) orientation.

11. The floating single crystal thin film of claim 9 wherein said enclosure material is boron-doped silicon.

12. The floating single crystal thin film of claim 9 wherein one or both of said single crystal substrate and said covering layer is a material having a low rate of etching against an anisotropic etchant.

13. The floating single crystal thin film of claim 9 wherein a metallic cover layer is formed on said insulating layer prior to formation of said windows and said hollow through section and is subsequently removed after said formation.

14. The floating single crystal thin film of claim 13 wherein said metallic cover layer is a dual layer of gold and titanium.

15. A floating single crystal thin film comprising:
   a) a single crystal substrate;
   b) an insulating layer formed on upper and lower main surfaces of said single crystal substrate;
   c) at least a pair of first windows formed through said insulating layer on said upper surface and extending into said single crystal substrate;
   d) a second window formed through said insulating layer formed on said lower surface and into said single crystal substrate, said second window interconnecting said pair of first windows; and
   e) said pair of first windows having a covering layer formed on surfaces thereof;
   f) wherein a single crystal thin film is formed above said second window and enclosed by said covering layer.

16. The floating single crystal thin film of claim 15 wherein one or both of said single crystal substrate and said covering layer is a material having a low rate of etching against an anisotropic etchant.

17. The floating single crystal thin film of claim 15 wherein said single crystal substrate is silicon having a (111) orientation.

18. The floating single crystal thin film of claim 9 wherein said single crystal substrate is gallium arsenide.

19. The floating single crystal thin film of claim 15 wherein said single crystal substrate is gallium arsenide.

* * * * *